(12) United States Patent
Urbahn et al.

(10) Patent No.: US 11,508,506 B2
(45) Date of Patent: Nov. 22, 2022

(54) LEAD AND THERMAL DISCONNECT FOR RAMPING OF AN MRI OR OTHER SUPERCONDUCTING MAGNET

(71) Applicant: KONINKLIJKE PHILIPS N.V., Eindhoven (NL)

(72) Inventors: John Urbahn, Latham, NY (US); Philippe Abel Menteur, Niskayuna, NY (US); Glen George Pfleiderer, Voorheesville, NY (US); Matthew Voss, Clinton Park, NY (US)

(73) Assignee: Koninklijke Philips N.V., Eindhoven (NL)

( * ) Notice: Subject to any disclaimer, the term of this patent is extended or adjusted under 35 U.S.C. 154(b) by 1077 days.

(21) Appl. No.: 16/092,817

(22) PCT Filed: Apr. 12, 2017

(86) PCT No.: PCT/EP2017/058869
§ 371 (c)(1),
(2) Date: Oct. 11, 2018

(87) PCT Pub. No.: WO2017/178560
PCT Pub. Date: Oct. 19, 2017

(65) Prior Publication Data
US 2019/0108933 A1    Apr. 11, 2019

Related U.S. Application Data

(60) Provisional application No. 62/321,271, filed on Apr. 12, 2016.

(51) Int. Cl.
*H01F 6/06* (2006.01)
*H01F 6/04* (2006.01)
(Continued)

(52) U.S. Cl.
CPC ......... *H01F 6/065* (2013.01); *G01R 33/3804* (2013.01); *G01R 33/3815* (2013.01); *H01F 6/04* (2013.01)

(58) Field of Classification Search
CPC ....... H01F 6/065; H01F 6/04; G01R 33/3804; G01R 33/3815
See application file for complete search history.

(56) References Cited

U.S. PATENT DOCUMENTS 4,544,979 A * 10/1985 Ennis, Jr. ............... H01F 6/065
                                                        335/216
5,432,297 A *  7/1995 Dederer ................. H02G 15/34
                                                        505/700
(Continued)

FOREIGN PATENT DOCUMENTS

GB        2436233 A    9/2007
JP     2003115404 A    4/2003
(Continued)

OTHER PUBLICATIONS

Choi et al., "Electrical Contact Resistance of Multi-Contact Connector in Semi-Retractable Current Lead," in IEEE Transactions on Applied Superconductivity, vol. 21, No. 3, pp. 1050-1053, Jun. 2011 (Year: 2011).*

*Primary Examiner* — Daniel R Miller

(57) ABSTRACT

A superconducting magnet (10) includes a cryogenic container (22, 32) containing a superconducting magnet winding (20). A sealed electrical feedthrough (36) passes through the cryogenic container. A contactor (40) inside the cryogenic container has an actuator (42) and feedthrough-side and magnet-side electrical terminals (46, 47). A high temperature superconductor (HTS) lead (60) also disposed in the cryogenic container has a first end (62) electrically connected with the magnet-side electrical terminal of the contactor and a second end (64) electrically connected to the (Continued)

superconducting magnet winding. A first stage thermal station (52) thermally connected with the first end of the HTS lead has a temperature (T1) lower than the critical temperature (TC,HTS) of the HTS lead. A second stage thermal station (54) thermally connected with the second end of the HTS lead has a temperature (T2) lower than a critical temperature (TC) of the superconducting magnet winding (20).

24 Claims, 4 Drawing Sheets

(51) Int. Cl.
*G01R 33/38* (2006.01)
*G01R 33/3815* (2006.01)

(56) References Cited

U.S. PATENT DOCUMENTS

| | | | |
|---|---|---|---|
| 9,552,906 B1 * | 1/2017 | Mine | H02G 15/34 |
| 2008/0079428 A1 | 4/2008 | Huang et al. | |
| 2010/0113282 A1 | 5/2010 | Kawashima | |
| 2012/0094840 A1 | 4/2012 | Tanaka et al. | |
| 2014/0028316 A1 | 1/2014 | Mine et al. | |
| 2015/0045226 A1 | 2/2015 | Overweg et al. | |
| 2017/0038123 A1 | 2/2017 | Strickland et al. | |

FOREIGN PATENT DOCUMENTS

| | | | |
|---|---|---|---|
| JP | 2013065659 A | | 4/2013 |
| JP | 2013175293 A | | 9/2013 |
| JP | 2014187148 A | | 10/2014 |
| WO | 2016005882 A1 | | 1/2016 |
| WO | WO-2017057760 A1 * | | 4/2017 |

* cited by examiner

LEAD AND THERMAL DISCONNECT FOR RAMPING OF AN MRI OR OTHER SUPERCONDUCTING MAGNET

CROSS REFERENCE TO RELATED APPLICATIONS

This application is a U.S. national phase application of International Application No. PCT/EP2017/058869, filed on Apr. 12, 2017, which claims the benefit of U.S. provisional Application Ser. No. 62/321,271 filed on Apr. 12, 2016 and is incorporated herein by reference.

FIELD

The following relates generally to the superconducting magnet arts, and to the magnetic resonance imaging and spectroscopy arts employing same.

BACKGROUND

In a conventional superconducting magnet design, superconducting windings comprise superconductor such as niobium-titanium, niobium-tin, or so forth which have a critical temperature ($T_C$) that is typically below 20K. To maintain the magnet winding below this critical temperature, the windings are typically immersed in liquid helium (LHe) contained in a vacuum-jacketed cryogenic dewer. Advantageously, LHe has a boiling point of about 4K at atmospheric pressure. Other cryogenic containers capable of maintaining the contained superconducting windings at below the critical temperature could also be used.

Superconducting magnets find use in various systems. For example, a magnetic resonance (MR) imaging system (or spectroscopy system) may use a superconducting magnet for generating the static ($B_0$) magnetic field at a high magnetic field strength which may be on the order of several Tesla. A magnet achieving such high field may flow several hundred amperes of DC electrical current. In a conventional resistive winding, this would result in severe heating and high power requirements—by contrast, a superconducting magnet winding presents zero resistance to the current flow, and the current is a persistent current due to the absence of any electrical resistance.

Since the current flow is persistent, a superconducting MR magnet typically has no permanently connected leads, as they are not needed and would only introduce detrimental thermal leakage. When the magnet current is to be ramped up or down, the LHe cryostat is opened and conductors are inserted into the LHe to connect with terminals of the superconducting magnet windings. After the ramp, the conductors are removed and the LHe cryostat is closed up.

The following discloses a new and improved systems and methods that address the above referenced issues, and others.

SUMMARY

In one disclosed aspect, an automated electrical connect/disconnect device is provided for electrically connecting with and electrically disconnecting from a superconducting magnet winding. The device comprises: a contactor having an actuator and electrical terminals that are electrically isolated from each other when the contactor is open and electrically connected when the contactor is closed; a high temperature superconductor (HTS) lead having a superconducting critical temperature of at least 25K; and one or more electrical conductors electrically connecting a magnet-side electrical terminal of the contactor and a first end of the HTS lead. A second end of the HTS lead is connected to, or configured for connection to, the superconducting magnet winding. The device may further include a first stage thermal station thermally connected with the first end of the HTS lead. The first stage thermal station has a first stage temperature that is lower than the superconducting critical temperature of the HTS lead. A second stage thermal station may be further provided, which is thermally connected with the second end of the HTS lead. The second stage thermal station has a second stage temperature that is lower than a superconducting critical temperature of the superconducting magnet winding. In some embodiments, a two-stage compressed helium cryogenic refrigerator is provided, which has the first stage thermal station and the second stage thermal station. Instead of providing the second stage thermal station, the second end of the HTS lead may be arranged to be disposed in liquid helium within which the magnet winding is immersed.

In another disclosed aspect, a superconducting magnet comprises a cryogenic container and a superconducting magnet winding disposed in the cryogenic container. A sealed electrical feedthrough passes through the cryogenic container. A contactor is disposed in the cryogenic container and has an actuator, a feedthrough-side electrical terminal electrically connected with the sealed electrical feedthrough, and a magnet-side electrical terminal that is electrically isolated from the feedthrough side electrical terminal when the contactor is open and is electrically connected with the feedthrough side electrical terminal when the contactor is closed. A high temperature superconductor (HTS) lead is also disposed in the cryogenic container. The HTS lead has a first end electrically connected with the magnet-side electrical terminal of the contactor and a second end electrically connected to the superconducting magnet winding. A first stage thermal station may be thermally connected with the first end of the HTS lead. The first stage thermal station has a first stage temperature that is lower than the superconducting critical temperature of the HTS lead. A second stage thermal station may be thermally connected with the second end of the HTS lead. The second stage thermal station has a second stage temperature that is lower than a superconducting critical temperature of the superconducting magnet winding.

In another disclosed aspect, an automated electrical connect/disconnect device is disclosed for electrically connecting with and electrically disconnecting from a superconducting magnet winding. The device comprises: a contactor configured to switch from an open state to a closed state in response to an actuator signal; a sealed electrical feedthrough electrically connected to the contactor; and a high temperature superconductor (HTS) lead having a superconducting critical temperature of at least 25K. The HTS lead has a first end connected to the contactor and a second end connected to or configured for connection to the superconducting magnet winding. The contactor electrically connects the sealed electrical feedthrough and the first end of the HTS lead in the closed state, and electrically disconnects the sealed electrical feedthrough and the first end of the HTS lead in the open state. The device may further include a first stage thermal station that is thermally connected with the first end of the HTS lead. The first stage thermal station has a first stage temperature that is lower than the superconducting critical temperature of the HTS lead. In some embodiments, the contactor is an electromechanical contactor having a thermal break in the open state.

One advantage resides in reduced manual operations in performing a superconducting magnet current ramp.

Another advantage resides in providing faster magnet current ramping operations.

Another advantage resides in providing reduced boil-off of LHe during magnet current ramping operations.

Another advantage resides in providing for performing magnet current ramping operations without opening the cryogenic vessel containing the magnet windings.

Another advantage resides in providing for performing magnet current ramping operations with increased safety.

A given embodiment may provide none, one, two, more, or all of the foregoing advantages, and/or may provide other advantages as will become apparent to one of ordinary skill in the art upon reading and understanding the present disclosure.

BRIEF DESCRIPTION OF THE DRAWINGS

The invention may take form in various components and arrangements of components, and in various steps and arrangements of steps. The drawings are only for purposes of illustrating the preferred embodiments and are not to be construed as limiting the invention. Unless otherwise noted, the drawings are diagrammatic and are not to be construed as being to scale or to illustrate relative dimensions of different components.

DETAILED DESCRIPTION

Various disadvantages of typical existing superconducting magnet ramping systems and methods are recognized herein. Opening a liquid helium (LHe) dewar to access superconducting winding terminals immersed in the LHe and then inserting conductors into the LHe produces substantial helium boil-off, which is problematic given the presently limited global supply of helium. Opening any cryogenic magnet container also increases the time and human resources that need to be allocated for magnet servicing, and may bring service personnel into contact with cryogenic fluids and/or surfaces at cryogenic temperatures, thus implicating safety considerations. If the cryogenic container includes one or more evacuated plenums (for example, a vacuum jacket of a cryogenic dewar), then there is also the potential to inadvertently break vacuum during the opening.

In embodiments disclosed herein, an automated electrical connect/disconnect device is provided for automatically electrically connecting to, and disconnecting from, superconducting magnet windings. The disclosed devices avoid opening the cryogenic container within which the superconducting magnet windings are disposed. The disclosed devices accommodate the large thermal gradient from room temperature to the magnet winding temperature (around 4K in many magnet designs) without exposing the superconducting windings to temperature higher than the critical temperature, even at connections of the windings to the connect/disconnect device. The disclosed connect/disconnect device also can carry high magnet current, which may be on the order of hundreds of amperes in some superconducting magnet designs.

Figure 1:
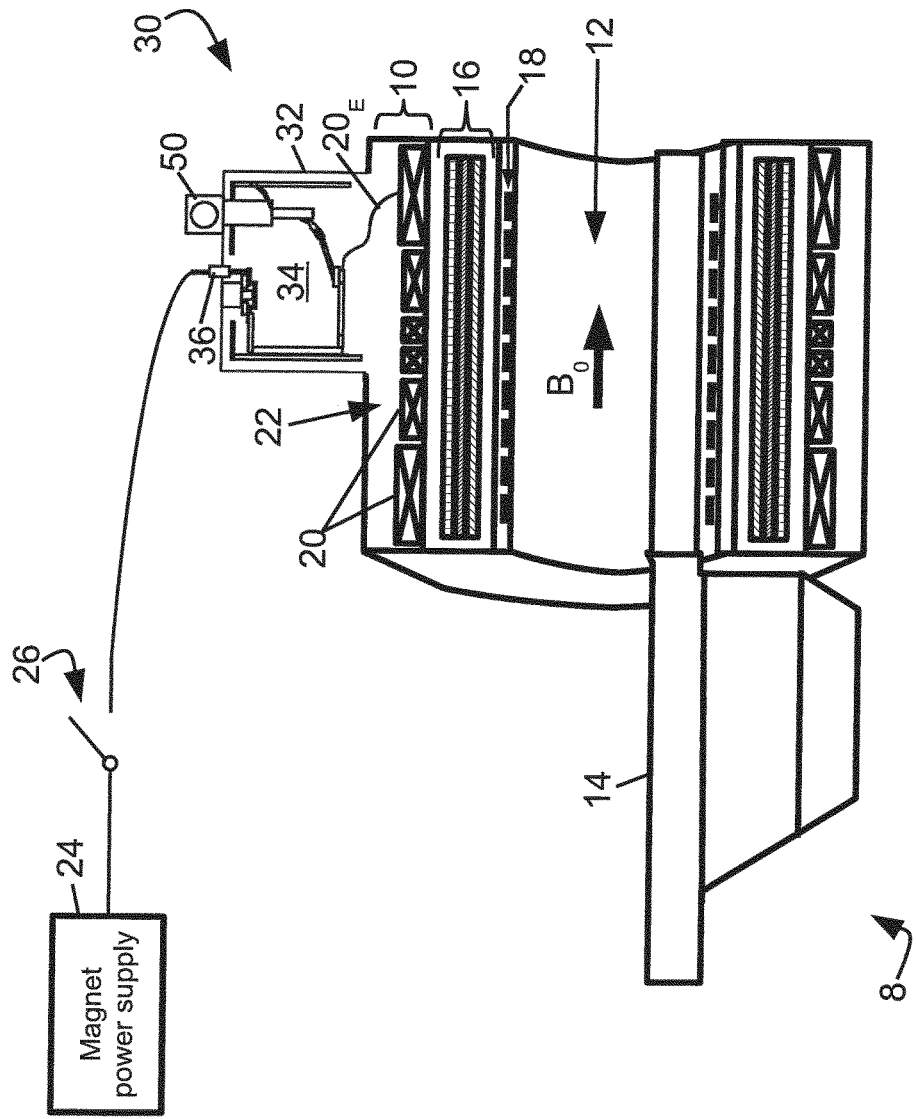
FIG. 1 diagrammatically shows a side sectional view of a magnetic resonance (MR) imaging system including a superconducting magnet with an automated electrical connect/disconnect device as disclosed herein.

With reference to FIG. 1, an illustrative magnetic resonance (MR) imaging system 8 includes a superconducting magnet 10, which in the illustrative embodiment is a horizontal solenoidal superconducting magnet 10 defining a horizontal bore 12 into which a patient or other imaging subject is inserted for MR imaging and/or spectroscopy. A couch or other patient support 14 may be provided for loading the patient. The MR imaging system 8 further includes, in addition to the superconducting magnet 10, other components known in the MR arts such as resistive magnetic field gradient coils 16, a whole-body radio frequency (RF) coil 18 (and/or one or more local RF coils, not shown), and so forth. These components are used in known ways to acquire MR imaging and/or spectroscopy data. For example, in one illustrative imaging sequence, the operating superconducting magnet 10 produces a static ($B_0$) magnetic field in an examination region within the bore 12. In some embodiments, the magnitude $|B_0|$ of this field may be 1.5 Tesla, 3.0 Tesla, 7.0 Tesla, or so forth. The $B_0$ magnetic field (statistically) orients nuclear spins, which are excited by RF pulses applied by the RF coil 18. The excited magnetic resonance is spatially limited and/or phase- and/or frequency-encoded by magnetic field gradients applied by the magnetic field gradient coils 16, and the thusly manipulated excited magnetic resonance are detected by the RF coil 18 to generate MR imaging data. An image reconstruction algorithm suitable for the chosen spatial encoding may be applied to reconstruct an MR image from the acquired MR imaging data. Additionally or alternatively, the excited and detected magnetic resonance may be analyzed spectroscopically.

The illustrative application is MR imaging or spectroscopy; however, it is to be understood that the disclosed automated electrical connect/disconnect devices may be used for electrically connecting with or disconnecting from substantially any type of superconducting magnet winding. For example, the disclosed automated electrical connect/disconnect devices may also be used for electrically connecting with or disconnecting from superconducting magnets used in particle accelerators, magnetic levitation systems, laboratory testing devices that employ superconducting magnets, and so forth.

With continuing reference to FIG. 1, the superconducting magnet 10 includes superconducting magnet windings 20 disposed in a cryogenic container 22 and powered by a DC magnet power supply 24 via suitable current control circuitry such as a diagrammatically indicated relay 26. While the illustrative relay current control 26 merely provides binary (on/off) current control, more generally it will be understood that the magnet power supply 24 and control circuitry 26 may provide more elaborate current control, such as ramping up the current gradually from zero to a target value (in which case the relay 26 may optionally be omitted in favor of gradual current amperes ramp-up and ramp-down), such more elaborate control being readily implemented, for example, via electronic variable resistances or the like under controller of an electronic microcontroller. Gradual current amperes changes are generally preferred due to the very high inductance of the magnet windings and the potential for eddy current and/or mechanical stress induced quench.

Magnet windings 20 include suitable superconducting material such as niobium-titanium, niobium-tin, or so forth which have a critical temperature ($T_C$) that is typically below 20K. The cryogenic container 22 serves the purposes of containing the superconducting windings 20, preventing contact with air and consequent build-up of condensed ice on the windings 20, and providing a cryogenic environment in which the windings 20 are kept at a temperature below the critical temperature ($T_C$) for superconductivity. In some embodiments, the cryogenic container 22 is a vacuum-jacketed cryogenic dewar containing liquid helium (LHe) within which the magnet windings 20 are immersed. In other contemplated embodiments, the cryogenic container 22 may have an evacuated central volume within which the windings 20 are disposed, with the windings 20 in thermal communication with container walls that are maintained at a temperature below $T_C$ by, for example, flowing LHe in a wall plenum and/or cooling the container walls using a cryogenic refrigerator, for example using gas helium as the working fluid in order to achieve a temperature of around 4K. It is emphasized that the superconducting windings 20 and the cryogenic container 22 are diagrammatically depicted, with the configuration of these components being chosen for a specific application and specific application design goals and constraints.

With continuing reference to FIG. 1 and with further reference to FIG. 2, electrical connection may be made to the superconducting windings 20, and such connection may subsequently be disconnected, in an automated fashion without opening the cryogenic container 22 to physically access the windings 20. Such electrical connection and disconnection is achieved by way of an automated electrical connect/disconnect device 30. In the following, the electrical current path for connecting/disconnecting a single terminal of the magnet windings 20 is illustrated and described; however, it will be understood that at least two such connections are provided to flow current into-through-out of the magnet windings 20 (that is, to form a complete circuit), and provision of three or more such electrical connections is contemplated if, for example, the windings 20 comprise two or more separately drivable winding sections. To enable electrical connection/disconnection without opening the cryogenic container 22, the electrical connect/disconnect device 30 is housed in a sealed vessel 32 that is connected with the cryogenic container 22. For example, the sealed vessel 32 may be integral with the cryogenic container 22 (e.g., formed as a protrusion of a forged container vessel of the cryogenic container 22 or disposed within the cryogenic container so that the cryogenic container also forms the housing of the electrical connect/disconnect device), or may be welded to the cryogenic container 22, or may be bolted to the cryogenic chamber 22 at a mating vacuum flange. An internal space 34 within the device housing 32 contains a controlled atmosphere. In the illustrative example of FIGS. 1 and 2, the controlled atmosphere is vacuum, maintained by one or more vacuum pumps (not shown) secured with the device housing 32 and/or by vacuum pumping of the connected cryogenic container 22 if this container has one or more vacuum spaces. In other embodiments, the controlled atmosphere may be different, e.g. the device housing may be backfilled with gas helium, possibly evolved from the surface of LHe contained in the cryogenic container 22 (see embodiment of FIG. 4). The controlled atmosphere should be chosen to avoid buildup of condensate (e.g. ice, condensed nitrogen) on cryogenic surfaces which as described below may be at temperatures as low as about 4K. In the illustrative embodiments the internal space 34 is in fluid communication with the volume of the cryogenic container 22 that contains the magnet windings 20 so that both volumes contain the same controlled atmosphere (e.g. gas helium or vacuum); however, it is contemplated to provide a gas-tight (or at least low leakage) seal at the interface between the two volumes so that they can contain different atmospheres.

A high current sealed electrical feedthough 36 provides electrical coupling through the sealed housing 32 of the automated electrical connect/disconnect device 30. The high current sealed electrical feedthough 36 is rated for carrying the maximum rated magnet ramping current amperage (which may be on the order of hundreds of amperes in some magnet designs) through the sealed enclosure 32. The sealed feedthrough 36 is sealed to maintain vacuum in the internal space 34.

The sealed electrical feedthrough 36 feeds electrical power to an electrically operated contactor 40, which again is rated for the maximum rated magnet ramping current amperage. (Note, due to drawing space constraints some components of the device 30 are labeled only in the enlarged sectional view of FIG. 2 and are not labeled in the smaller view of FIG. 1.) The contactor 40 is preferably normally open since the magnet windings 20 are normally operated with a persistent current and the open contactor 40 breaks the thermal pathway from the sealed feedthrough 36. FIG. 2 shows the contactor 40 in its normally open position or state. The illustrative contactor 40 is an electromechanical device including an actuator 42 that, when energized to close the contact, raises an electrical conductor 44 into contact (i.e. engage) with electrical terminals 46, 47 to conduct electric current. The contactor 40 is activated to close (i.e. transition to its closed state) by an actuator signal applied from outside the device housing 32. The actuator signal may, for example, be a magnetic field applied by an external electromagnet (not shown) that attracts a permanent magnet of the actuator 42 to draw it upward and lift the electrical conductor 44. (In a variant embodiment, the electrical conductor is in continuous electrical contact with one electrical terminal and the actuator rotates or swings the conductor about a hinge to contact the other electrical terminal.) In another embodiment, the actuator 42 includes an internal electromagnet that is energized by leads passing through the housing 32 by suitable sealed electrical feedthroughs (not shown). Substitution of a solid-state electronic component, e.g. a solid state relay, is contemplated, however the solid-state contactor should preferably be chosen to provide minimal thermal conductance. In the case of a solid state component, the actuator may, for example, be a gate circuit of the solid state component.

The illustrative electromechanical contactor 40 advantageously provides a thermal open-circuit when in its normally open position. However, when the contactor 40 is closed, a thermal path exists from the sealed feedthrough 36, which is typically at about room temperature (e.g. ~293K), through the engaged electrical conductor 44 to the magnet-side terminal 47 of the contactor 40. On the other hand, an end $20_E$ of the superconducting magnet winding 20 to which the electrical current is to connect is at the magnet winding temperature, e.g. around 4K for typical superconducting winding materials.

The illustrative automated electrical connect/disconnect device 30 bridges this large thermal gradient in two stages. To this end, a two-stage compressed helium cryogenic refrigerator 50, also sometimes referred to as a cold head 50, maintains a first stage thermal station 52 at a first-stage temperature $T_1$ that is below room temperature and above the critical temperature $T_C$ for the superconducting material of the superconducting windings 20, and a second stage thermal station 54 that is at a second-stage temperature $T_2$ that is below the critical temperature $T_C$ for the superconducting material of the superconducting windings 20. That is, $T_1 > T_2 > T_C$. As will be described, a thermal shield 56 is kept at about the first stage temperature $T_1$. The first stage temperature $T_1$ should also be below the critical temperature $T_{C,HTS}$ of a high temperature superconductor (HTS) material comprising HTS lead 60, which again is further described below In some embodiments, the first stage temperature $T_1$ is in the range 25-80K, while the second stage temperature $T_2$ is close to the LHe boiling point of about 4K, although slightly higher temperature for $T_2$ is contemplated depending upon $T_c$ of the superconducting windings 20. The cryogenic refrigerator 50 may, for example, be a typical two-stage cold head employing compressed helium gas (compressor and helium gas hosing not shown).

The first stage thermal station 52 is preferably designed to provide thermal shielding partially or wholly surrounding components at the lower temperature $T_2$ maintained by the second stage thermal station 54. In the illustrative example, the thermal shielding arrangement is achieved by way of the illustrative thermal shield 56, which may for example be an aluminum alloy enclosure although other thermally conductive metals or materials are alternatively contemplated. The thermal shield 56 is maintained at about the first-stage temperature $T_1$ by a thermal connection with the first stage thermal station 52, e.g. provided by thermally conductive connector cables of copper or the like, or alternatively by a convective cooling system (not shown). The thermal shield 56 is thermally isolated from the device housing 32, for example by being spaced apart from the housing 32.

The HTS lead 60 has a first end 62 held at about the first stage temperature $T_1$, and a second end 64 held at about the first stage temperature $T_2$. The HTS lead 60 is made of a high temperature superconductor (HTS) material such as bismuth strontium calcium copper oxide (BSCCO), yttrium barium copper oxide (YBCO), or magnesium diboride ($MgB_2$). HTS materials are typically, though not necessarily, ceramic materials and have relatively high superconducting critical temperatures. For example, some members of the BSCCO and YBCO material families have $T_{C,HTS}$ of about 90K or higher, while $MgB_2$ has $T_{C,HTS} \sim 39K$. In general, the HTS should have $T_{C,HTS}$ of at least 25K. Thus, with its first end 62 held at $T_1$ and its second end 64 held at $T_2$, the HTS lead 60 is maintained in the superconducting state so long as $T_1 < T_{C,HTS}$ and $T_2 < T_1$. The maximum allowable value for $T_1$ is thus determined by the superconducting critical temperature $T_{C,HTS}$ of the HTS lead 60.

The magnet-side terminal 47 of the contactor 40 is electrically connected with the first end 62 of the HTS lead 60 by one or more electrical conductors 70, 71. This provides electrical flow between the closed contactor 40 and the first end 62 of the HTS lead 60. This portion of the electrical path including the magnet-side terminal 47, the conductors 70, 71, and the first end 62 of the HTS lead 60 is kept at about the first-stage temperature $T_1$ by thermal contact with the first stage thermal station 52. In the illustrative embodiment of FIG. 2, this thermal contact is achieved via the thermal shield 56, with a thermally conductive but electrically isolating element 74 interposed between the thermal shield 56 and the electrical conductors 70, 71 to prevent electrical shunting to the metallic thermal shield 56. The interposed thermally conductive but electrically isolating element 74 may, for example, be a thin fiberglass such as a G-10 fiberglass mat. It should be noted that while these components 47, 70, 71, 62 are kept at about the first stage temperature $T_1$, some significant deviation from precisely $T_1$ is contemplated and acceptable, so long as the first end 62 of the HTS lead 60 is kept below its superconducting critical temperature $T_{C,HTS}$. In practice, the temperature of these components 47, 70, 71, 62 that are kept at about the first stage temperature $T_1$ may actually be at a temperature somewhat above $T_1$ due to heat transfer from the surrounding device enclosure 32, which is at about room temperature, which may raise the temperature of the thermal shield 56 above $T_1$. Again, this is acceptable so long as the temperature of the first end 62 of the HTS lead 60 is kept below its superconducting critical temperature $T_{C,HTS}$.

The thermal transition from the first stage temperature $T_1$ (e.g., 25-80K in some embodiments) to the temperature $T_2$ (which is at or below the temperature of the connected end $20_E$ of the superconducting winding 20) is achieved by a temperature gradient (decrease) over the length of the HTS lead 60 from the first end 62 at about $T_1$ to the second end 64 at about $T_2$. To maintain temperature stability, the second end 64 of the HTS lead 60 is preferably maintained at about the second stage temperature $T_2$ by thermal contact with the second stage thermal station 54, as diagrammatically indicated in FIG. 2. This thermal contact can take various forms, such as conductive thermal contact via a copper conductor or other thermally conductive material path, convective thermal contact for example via flowing gas helium or LHe, or so forth. The second end 64 of the HTS lead 60 is electrically connected with the end $20_E$ of the superconducting winding 20 by any suitable approach, such as interweaving of fibers of the end $20_E$ with the second end 64 of the HTS lead 60. This electrical connection can also be thermally conductive, since the second end 64 is at the temperature $T_2$ which is at about, or below, the operating temperature of the superconducting magnet winding 20.

The purpose of the first stage thermal station 52 is to divert heat loads during ramping to the first stage thermal station 52 of the cryogenic refrigerator system and thereby limit the heating of the HTS lead 60 and the proximate end $20_E$ of the superconducting magnet winding 20. These heat loads are diverted so that the HTS lead 60 and the superconducting magnet winding 20 is maintained cold (below their respective superconducting critical temperatures $T_{C,HTS}$ and $T_C$) in order to function. Preferably, the first stage thermal station 52 is electrically isolated from the magnet ground via the use of the isolation material 74 which is thermally conductive but electrically insulating.

The purpose of the HTS lead 60 is to convey the main magnet ramping current, which is typically hundreds of amps, between the first stage thermal station 52 (actually carried by the conductive elements 47, 70, 71) which is generally below 80 K (and more particularly below $T_{C,HTS}$ of the HTS lead 60) and the superconducting magnet winding 20 which is at approximately 4K (and more particularly below $T_c$ of the winding 20). The HTS lead 60 carries electrical current to the connected end $20_E$ of the magnet winding 20 without also conducting detrimentally high heat loads to the 4K superconducting magnet winding 20 as would be the case with conventional, non-superconducting leads.

As mentioned previously, FIG. 2 illustrates one electrical path for feeding one end $20_E$ of the magnet winding 20. To provide a closed circuit for feeding electric current to the magnet winding 20, two such ends $20_E$ must be similarly powered, and more than two may be needed if the magnet includes two or more separately driven winding sections. Thus, a separate instance of the electrical flow path including the feedthrough 36, contactor 40, conductors 70, 71, and HTS lead 60 is provided for each contacted end of the magnet winding. A common device housing 32, cryogenic refrigerator 50, and thermal shield 56 may service all such electrical flow paths. Also not illustrated is a persistent switch that shorts the two ends $20_E$ of the superconducting coil together in persistent mode. This switch is suitably embodied as a superconducting link connecting the two ends with a resistive heater wrapped around the link. In persistent mode the heater is off and the superconducting link shorts the ends; when current is to be ramped, the resistive heater is turned on to heat the link above the critical temperature $T_C$ so as to transition the link to a resistive state.

Figure 2:
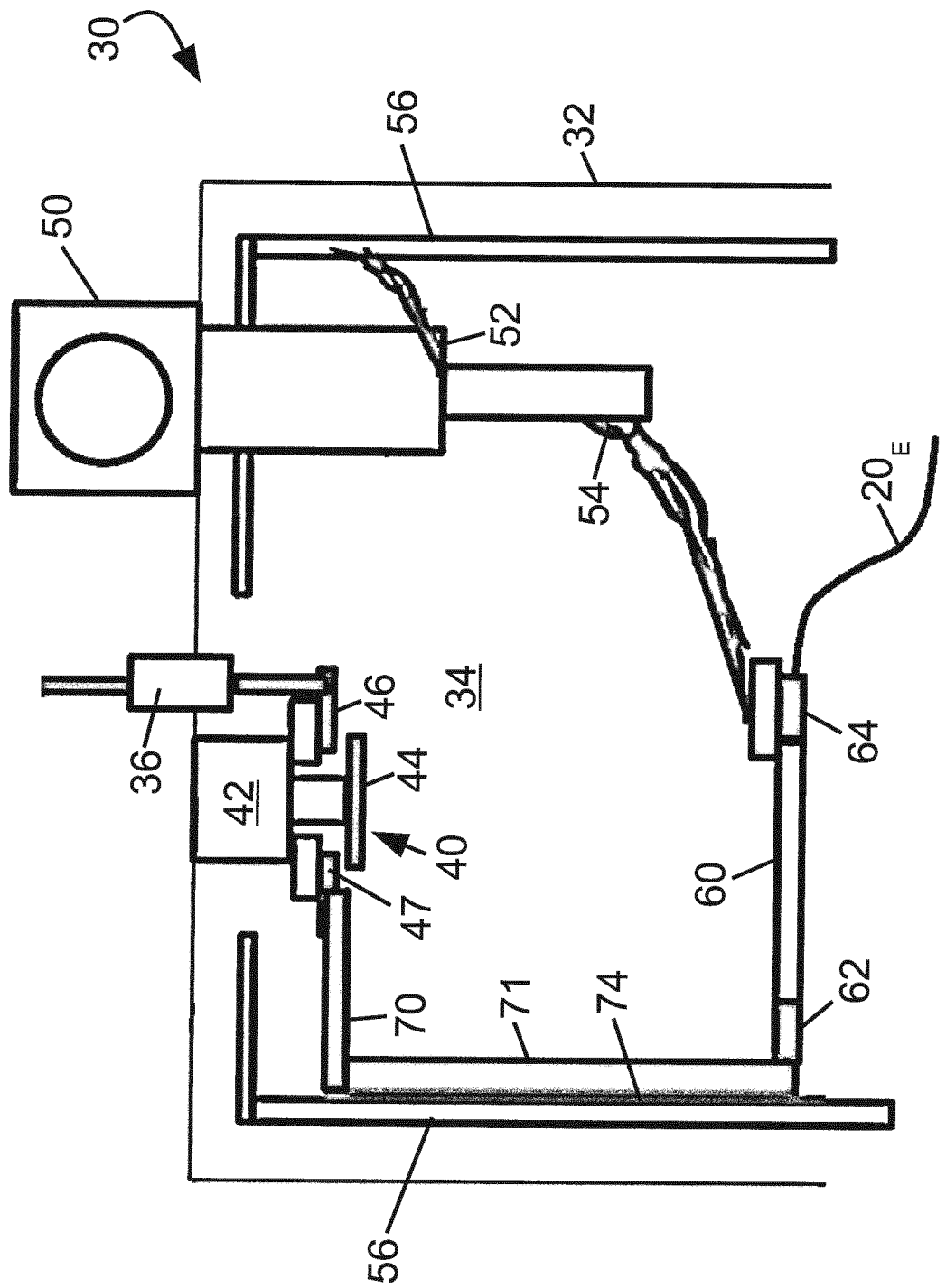
FIG. 2 diagrammatically shows an enlarged side sectional view of the automated electrical connect/disconnect device of FIG. 1.
Figure 3:
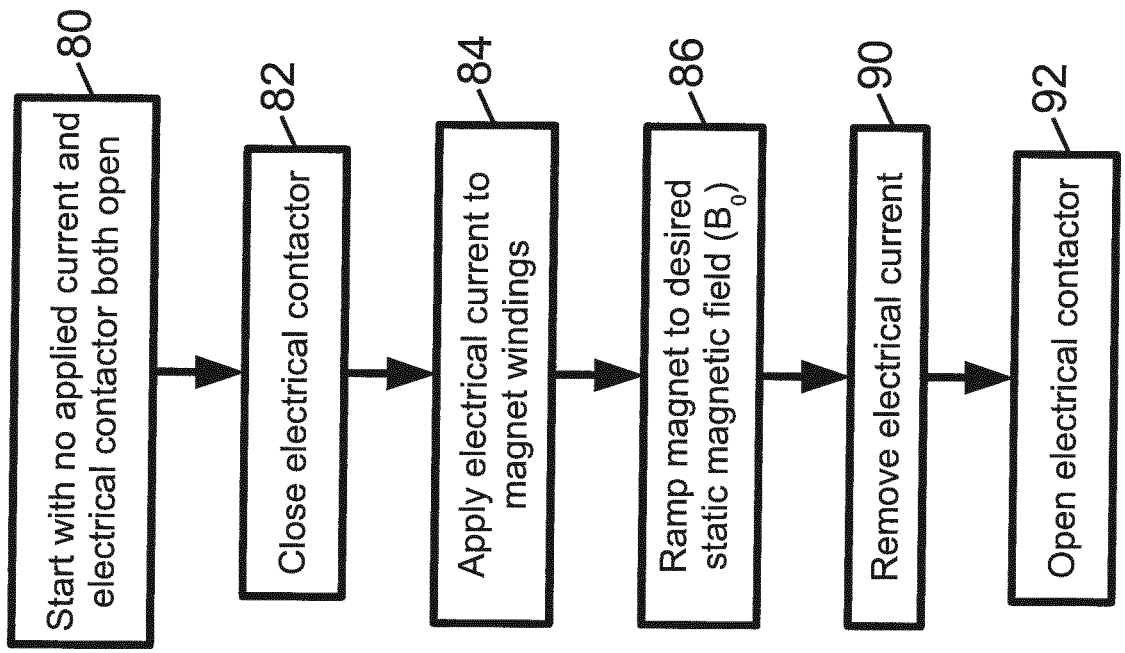
FIG. 3 diagrammatically shows a magnet current ramp process suitably performed on the superconducting magnet of FIG. 1 using the automated electrical connect/disconnect device.

With reference to FIG. 3, a magnet ramp process suitably performed using the automated electrical connect/disconnect device 30 of FIGS. 1 and 2 is described. The starting point 80 assumed is the magnet 10 either shut down (no persistent current) or operating in steady state with a persistent current. In this state the contactor 40 is in its normally open position (thus also providing a thermal open circuit at the contactor 40). The persistence switch (not shown) is also in the superconducting state (heater off). In an operation 82, the contactor 40 is activated to close, thus providing an electrical path from the feedthrough 36 to the end $20_E$ of the superconducting winding 20. Preferably, the magnet power supply 24 is initially set to not output any electric current, so that there is no instantaneous change in current flow through the highly inductive magnet winding 20 (thus avoiding a high inductively induced voltage that could lead to quenching of the superconductor). In an operation 84, electric current is applied to the magnet winding 20 via the now-closed flow path 36, 40, 70, 71, 60. The current is matched to the persistent current (if any persistent current is flowing in the magnet winding 20) before switching the persistent switch to the normal state (heater on). In an operation 86, the desired current ramp is applied using the magnet power supply 24 to achieve the desired static ($B_0$) magnetic field is obtained. (This target could be $B_0=0$ for de-energizing the magnet 10). With the desired $B_0$ magnetic field (equivalently, the desired magnet winding current) obtained, the persistent switch is returned to the superconducting state (heater off) and the electric current removed in an operation 90. Finally, in an operation 92 the contactor 40 is opened (de-energized) to reinstate the open thermal circuit.

Figure 4:
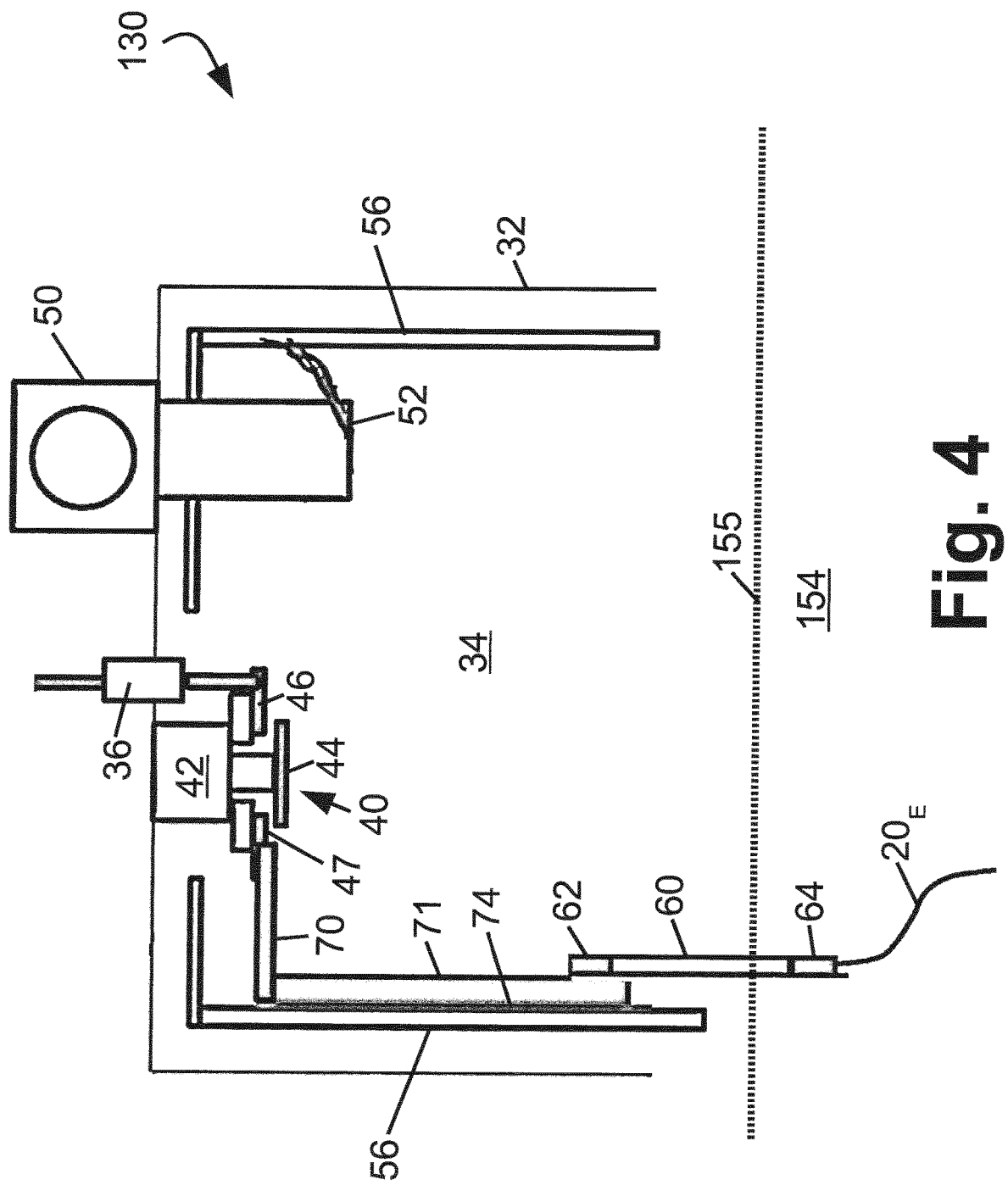
FIG. 4 diagrammatically shows a side sectional view of a variant embodiment of the automated electrical connect/disconnect device which leverages a liquid helium (LHe) immersion as the second stage.

With reference to FIG. 4, an alternative embodiment of the automated electrical connect/disconnect device 130 is described, which is suitable for use in conjunction with a superconducting magnet that is immersed in liquid helium (LHe) 154. Most components of this alternative device 130 are identical with corresponding components of the device 30 of FIG. 2, and these identical components are labeled with corresponding reference numbers. The device 130 differs from device 30 in that the second stage thermal station 54 is omitted or, viewed alternatively, is provided by the LHe 154 in which the magnet windings are immersed. The LHe 154 is at about 4K, which can be treated as the second stage temperature $T_2$ in this embodiment. Accordingly, the cryogenic refrigerator 50 can be a single-stage cryogenic refrigerator that omits the second stage thermal station 54 of the embodiment of FIG. 2. The liquid level 155 of the LHe 154 is diagrammatically indicated in FIG. 4—any component located below the LHe liquid level 155 is immersed in the LHe 154 and hence is at $T_2 \approx 4K$. In this embodiment, the HTS lead 60 is oriented vertically with the second end 64 below the first end 62. More particularly, the second end 64 is below the LHe level 155 and hence is immersed in the LHe 154. The second end 64 is thus held at the temperature $T_2 \approx 4K$, so that the LHe 154 serves the analogous function as the second stage thermal station 54 in the device 30 of FIG. 2. Operation of the device 130 is as already described for the device 30. As another distinction compared with the device 30, in the device 130 of FIG. 4 the internal space 34 within the device housing 32 is filled with gas helium evolved from the surface 155 of the LHe 154, rather than being a vacuum. In this respect, in some variant embodiments the device 130 may be located wholly within the LHe cryogenic dewar that forms the cryogenic container containing the magnet windings, with no defined separate housing 32 and the feedthrough 36 penetrating an external wall of the cryogenic container containing the magnet windings.

The invention has been described with reference to the preferred embodiments. Modifications and alterations may occur to others upon reading and understanding the preceding detailed description. It is intended that the invention be construed as including all such modifications and alterations insofar as they come within the scope of the appended claims or the equivalents thereof.

The invention claimed is:

1. An automated electrical connect/disconnect device for electrically connecting with and electrically disconnecting from a superconducting magnet winding, the device comprising:
   a contactor having an actuator and electrical terminals that are electrically isolated from each other when the contactor is open and electrically connected when the contactor is closed;
   a high temperature superconductor (HTS) lead having a superconducting critical temperature (TC,HTS) of at least 25K;
   one or more electrical conductors electrically connecting a magnet-side electrical terminal of the contactor and a first end of the HTS lead, a second end of the HTS lead connected to or configured for connection to the superconducting magnet winding; and
   a first stage thermal station thermally connected with the first end of the HTS lead, the first stage thermal station having a first stage temperature (T1) that is lower than the superconducting critical temperature (TC,HTS) of the HTS lead.

2. The device of claim 1, further comprising:
   a second stage thermal station thermally connected with the second end of the HTS lead, the second stage thermal station having a second stage temperature (T2) that is lower than a superconducting critical temperature (TC) of the superconducting magnet winding.

3. The device of claim 2, further comprising:
   a two-stage compressed helium cryogenic refrigerator having the first stage thermal station and the second stage thermal station.

4. The device of claim 1, wherein the second end of the HTS lead is arranged to be disposed in liquid helium within which the magnet winding is immersed.

5. The device of claim 1, further comprising:
   a thermal shield in thermal contact with the first stage thermal station.

6. The device of claim 1, further comprising:
   a device housing with an internal space containing at least the electrical terminals of the contactor, the HTS lead, and the one or more electrical conductors; and a sealed electrical feedthrough passing through a wall of the device housing and electrically connecting with a second electrical terminal of the contactor that is isolated from the magnet-side electrical terminal of the contactor when the contactor is open.

7. The device of claim 1, wherein the contactor is a normally open electromechanical contactor further including an electrical conductor that moves to close the contactor in response to activation of the actuator.

8. The device of claim 1, wherein the HTS lead comprises bismuth strontium calcium copper oxide (BSCCO), yttrium barium copper oxide (YBCO), or magnesium diboride (MgB2).

9. A superconducting magnet comprising:
   a cryogenic container;
   a superconducting magnet winding disposed in the cryogenic container;
   a sealed electrical feedthrough passing through the cryogenic container;
   a contactor disposed in the cryogenic container and having an actuator, a feedthrough side electrical terminal electrically connected with the sealed electrical feedthrough, and a magnet-side electrical terminal that is electrically isolated from the feedthrough side electrical terminal when the contactor is open and is electrically connected with the feedthrough side electrical terminal when the contactor is closed;
   a high temperature superconductor (HTS) lead disposed in the cryogenic container, the HTS comprising a first end electrically connected with the magnet-side electrical terminal of the contactor and a second end electrically connected to the superconducting magnet winding; and
   a first stage thermal station thermally connected with the first end of the HTS lead, the first stage thermal station having a first stage temperature (T1) that is lower than the superconducting critical temperature (TC,HTS) of the HTS lead.

10. The superconducting magnet of claim 9, further comprising:
    a second stage thermal station thermally connected with the second end of the HTS lead, the second stage thermal station having a second stage temperature (T2) that is lower than a superconducting critical temperature (TC) of the superconducting magnet winding.

11. The superconducting magnet of claim 10, further comprising:
    a two-stage compressed helium cryogenic refrigerator having the first stage thermal station and the second stage thermal station.

12. The superconducting magnet of claim 9, further comprising:
    a thermal shield in thermal contact with the first stage thermal station and partially or wholly surrounding at least the magnet-side electrical terminal of the contactor and the HTS lead.

13. The superconducting magnet of claim 9, wherein the contactor is an electromechanical contactor further including an electrical conductor that moves to close the contactor in response to activation of the actuator.

14. The superconducting magnet of claim 9, wherein the HTS lead comprises bismuth strontium calcium copper oxide (BSCCO), yttrium barium copper oxide (YBCO), or magnesium diboride (MgB$_2$).

15. The superconducting magnet of claim 9, wherein the superconducting magnet winding comprises at least one of a niobium-titanium superconducting material and a niobium-tin superconducting material.

16. An automated electrical connect/disconnect device for electrically connecting with and electrically disconnecting from a superconducting magnet winding, the device comprising:
    a contactor configured to switch from an open state to a closed state in response to an actuator signal;
    a sealed electrical feedthrough electrically connected to the contactor; and
    a high temperature superconductor (HTS) lead having a superconducting critical temperature ($T_{C,HTS}$) of at least 25K, the HTS lead having a first end connected to the contactor and a second end connected to or configured for connection to the superconducting magnet winding; and
    a first stage thermal station thermally connected with the first end of the HTS lead, the first stage thermal station having a first stage temperature ($T_1$) that is lower than the superconducting critical temperature ($T_{C,HTS}$) of the HTS lead, wherein the contactor electrically connects the sealed electrical feedthrough and the first end of the HTS lead in the closed state and electrically disconnects the sealed electrical feedthrough and the first end of the HTS lead in the open state.

17. The device of claim 16, wherein the contactor is an electromechanical contactor having a thermal break in the open state.

18. A superconducting magnet comprising:
    a cryogenic container;
    a superconducting magnet winding disposed in the cryogenic container;
    a sealed electrical feedthrough passing through the cryogenic container;
    a contactor disposed in the cryogenic container and having an actuator, a feedthrough side electrical terminal electrically connected with the sealed electrical feedthrough, and a magnet-side electrical terminal that is electrically isolated from the feedthrough side electrical terminal when the contactor is open and is electrically connected with the feedthrough side electrical terminal when the contactor is closed;
    a high temperature superconductor (HTS) lead disposed in the cryogenic container; and
    a first stage thermal station thermally connected with a first end of the HTS lead, the first stage thermal station having a first stage temperature (T1) that is lower than the superconducting critical temperature (TC,HTS) of the HTS lead;
    wherein: the HTS lead has a first end electrically connected with the magnet-side electrical terminal of the contactor and a second end electrically connected to the superconducting magnet winding; the cryogenic container is a liquid helium container configured to immerse the superconducting magnet winding in liquid helium; and the second end of the HTS lead is arranged to be disposed below the first end of the HTS lead and below a liquid level of the liquid helium in which the magnet winding is immersed.

19. The superconducting magnet of claim 18, further comprising:
    a second stage thermal station thermally connected with the second end of the HTS lead, the second stage thermal station having a second stage temperature (T2) that is lower than a superconducting critical temperature (TC) of the superconducting magnet winding.

20. The superconducting magnet of claim 19, further comprising:
   a two-stage compressed helium cryogenic refrigerator having the first stage thermal station and the second stage thermal station.

21. The superconducting magnet of claim 18, further comprising:
   a thermal shield in thermal contact with the first stage thermal station and partially or wholly surrounding at least the magnet-side electrical terminal of the contactor and the HTS lead.

22. The superconducting magnet of claim 18, wherein the contactor is an electromechanical contactor further including an electrical conductor that moves to close the contactor in response to activation of the actuator.

23. The superconducting magnet of claim 18, wherein the HTS lead comprises bismuth strontium calcium copper oxide (BSCCO), yttrium barium copper oxide (YBCO), or magnesium diboride ($MgB_2$).

24. The superconducting magnet of claim 18, wherein the superconducting magnet winding comprises at least one of a niobium-titanium superconducting material and a niobium-tin superconducting material.

* * * * *